United States Patent
Tsuchiya et al.

(10) Patent No.: US 9,985,187 B2
(45) Date of Patent: May 29, 2018

(54) METHOD OF MANUFACTURING LIGHT EMITTING DEVICE

(71) Applicant: TOYODA GOSEI CO., LTD., Kiyosu (JP)

(72) Inventors: Yosuke Tsuchiya, Kiyosu (JP); Hiroyuki Tajima, Kiyosu (JP); Toshiaki Mori, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days. days.

(21) Appl. No.: 15/299,505

(22) Filed: Oct. 21, 2016

(65) Prior Publication Data
US 2017/0117446 A1 Apr. 27, 2017

(30) Foreign Application Priority Data
Oct. 22, 2015 (JP) .................. 2015-207974

(51) Int. Cl.
| | |
|---|---|
| *H01L 33/60* | (2010.01) |
| *H01L 33/00* | (2010.01) |
| *H01L 33/50* | (2010.01) |
| *H01L 33/56* | (2010.01) |
| *H01L 33/62* | (2010.01) |

(52) U.S. Cl.
CPC .......... *H01L 33/60* (2013.01); *H01L 33/0095* (2013.01); *H01L 33/502* (2013.01); *H01L 33/56* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ......... H01L 33/60; H01L 33/62; H01L 33/56; H01L 33/0095; H01L 33/502; H01L 2933/0041; H01L 2933/005; H01L 2933/0058; H01L 2933/0066
See application file for complete search history.

(56) References Cited

U.S. PATENT DOCUMENTS

| | | | |
|---|---|---|---|
| 7,842,526 B2 | 11/2010 | Hadame et al. | |
| 2002/0185966 A1* | 12/2002 | Murano | H01L 33/505 313/501 |

FOREIGN PATENT DOCUMENTS

| | | |
|---|---|---|
| JP | 2003-046140 A | 2/2003 |
| JP | 4590994 B2 | 12/2010 |

* cited by examiner

*Primary Examiner* — Kyoung Lee
(74) *Attorney, Agent, or Firm* — McGinn IP Law Group, PLLC.

(57) ABSTRACT

A method of manufacturing a light emitting device, includes: mounting an LED chip on a substrate; forming a translucent sealing layer for sealing the LED chip; forming a protective layer on the sealing layer; forming a groove, which penetrates the substrate and the sealing layer, using a blade from a side opposite to the side of the substrate mounted with the LED chip, the groove being formed to extend to a lower surface or an inside of the protective layer; filling the groove with a reflector material; and removing and separating a portion of the protective layer in which at least the groove is formed, wherein the blade has a shape tapered toward an edge.

11 Claims, 5 Drawing Sheets

METHOD OF MANUFACTURING LIGHT EMITTING DEVICE

CROSS-REFERENCE TO RELATED APPLICATION(S)

This application is based upon and claims the benefit of priority from Japanese Patent Application No. 2015-207974, filed on Oct. 22, 2015, the entire contents of which are incorporated herein by reference.

BACKGROUND

1. Field of the Invention

The present invention relates to a method of manufacturing a light emitting device.

2. Description of the Related Art

An LED light emitting device is configured to include a reflector for light distribution control in many cases. In general, a mold is required to form the reflector, and this may cause an increase in a manufacturing cost of the light emitting device. When the reflector is formed using the mold, accuracy of the shape of the reflector to be formed is not necessarily high, and, as a result, the thickness of the reflector may become thicker than needs. On the other hand, a method of forming the reflector without using the mold has been also proposed. For example, a technique is disclosed in JP-A-2003-046140 in which an upwardly expanded reflector is formed in such a manner that a metal film is formed on an inner surface of a mesh-like mask made of a material soluble in an organic solvent and then the mask is dissolved and removed in the organic solvent (see, for example, FIG. 7 in JP-A-2003-046140).

Another technique is disclosed in Japanese Patent No. 4590994 in which a dicing process is performed on a ceramic substrate and a glass sealing member using a tapered blade of an inverted-V shape to form tapered side-faces on the glass sealing member and a white resin portion is provided to cover the side faces of the ceramic substrate and the side faces of the glass sealing member after separation for each LED chip by an additional dicing process of the glass sealing member (see, for example, FIG. 12 in Japanese Patent No. 4590994).

According to the technique disclosed in JP-A-2003-046140 described above, it is not necessary to use the mold in forming the reflector. However, since the mesh-like mask made of the material soluble in the organic solvent is formed and the mask should be dissolved and removed after the reflector is formed, there is a problem that steps of preparing the reflector become complicated.

According to Japanese Patent No. 4590994, the white resin portion for covering the tapered side faces of the glass sealing member functions as a reflector. However, the mold may be necessary to form the white resin portion after the separation for each LED chip.

SUMMARY

The invention has been made in view of the above-described circumstances, and an object thereof is to provide a method of manufacturing a light emitting device including a reflector in a simple way.

As a result of conducting extensive studies to solve the above problems, the inventors of the invention have completed aspects of the invention as will be described below.

According to an aspect of the invention, there is provided a method of manufacturing a light emitting device, including: mounting an LED chip on a substrate; forming a translucent sealing layer for sealing the LED chip; forming a protective layer on the sealing layer; forming a groove, which penetrates the substrate and the sealing layer, using a blade from a side opposite to the side of the substrate mounted with the LED chip, the groove being formed to extend to a lower surface or an inside of the protective layer; filling the groove with a reflector material; and removing and separating a portion of the protective layer in which at least the groove is formed, wherein the blade has a shape tapered toward an edge.

According to the manufacturing method according to the above-described aspect, it is possible to provide the reflector having a face (tapered face) suitable for the tapered side faces of the sealing layer. For this reason, light from the LED chip can be effectively reflected by the reflector, and thus light extraction efficiency from the sealing layer is improved. In addition, since a mold is not used to from the reflector, the light emitting device can be simply manufactured, and reduction in manufacturing cost can be also realized. Further, since an angle of the tapered face of the reflector can be adjusted depending on an angle of the cutting edge of the first tapered blade, it is possible to easily change an emission angle of light. In addition, since the protective layer is separated after the reflector is formed, there is also no problem that a mold is required to form the reflector after separation for each LED chip.

Further, according to another aspect of the invention, there is provided a method of manufacturing a light emitting device, including: mounting an LED chip on a substrate; forming a translucent sealing layer for sealing the LED chip; forming a groove, which penetrates the substrate and extends to the middle of the sealing layer, using a blade from a side opposite to the side of the substrate mounted with the LED chip; filling the groove with a reflector material; and cutting and separating a portion of the sealing layer in which the groove is formed, wherein the blade has a shape tapered toward an edge.

With such a method, the effects described above can be also similarly obtained. In this case, it is preferred in the groove forming step that the groove is formed to extend to the position higher than the upper surface of the chip. Thus, an upper end of the reflector to be subsequently formed is located at the position higher than the upper surface of the LED chip, and a high reflection effect can be obtained by the reflector.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

First Embodiment

Figure 1:
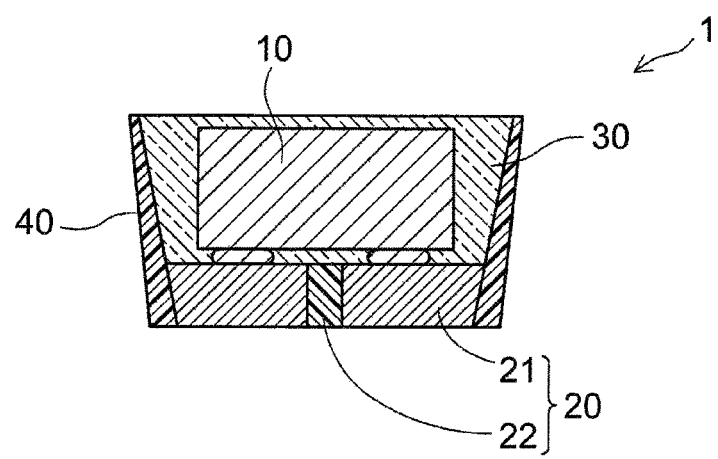
FIG. 1 is a cross-sectional view of a light emitting device according to a first embodiment of the invention.

FIG. 1 is a cross-sectional view of a light emitting device 1 according to a first embodiment of the invention. The light emitting device 1 includes an LED chip 10, a substrate 20 having a lead portion 21 and an insulating portion 22, a sealing layer 30, and a reflector 40.

The LED chip 10 is a flip-chip type, and is electrically connected to the lead portion 21 through a bump. The LED chip 10 may be a face-up type without being limited to the flip-chip type. In this case, the LED chip 10 can be electrically connected to the lead portion 21 by wire bonding.

The lead portion 21 of the substrate 20 is made of metal such as copper, aluminum, or gold or a conductive material such as a conductive resin, and the insulating portion 22 is made of a resin such as a glass epoxy resin or an insulating material such as ceramics.

The sealing layer 30 is formed of a transparent resin such as a silicone resin or an epoxy resin or a sealing material such as glass having translucency, and is formed in a reversed quadrangular pyramid shape so as to cover an upper surface of the substrate 20 and the entire exposed portion of the LED chip 10. That is, the sealing layer 30 has a tapered side face such that a cross-sectional area in a lateral direction becomes larger upward. The sealing layer 30 may contain phosphor particles.

The reflector 40 is made of a resin material such as white silicone, and is formed to cover the side face of the sealing layer 30. In addition, as long as reflectance is high with respect to an emission wavelength, resins of other colors may be used without being limited to the white resin.

(Method of Manufacturing the Light Emitting Device 1)

Figure 2A:
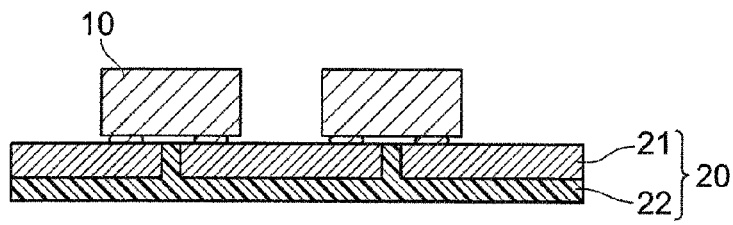
FIGS. 2A to 2E are explanatory diagrams illustrating a method of manufacturing the light emitting device according to the first embodiment of the invention.

FIGS. 2A to 2E are explanatory diagrams illustrating a method of manufacturing the light emitting device 1 according to the first embodiment of the invention. In this manufacturing method, first, a plurality of LED chips 10 are prepared, and are electrically connected to the lead portion 21 of the substrate 20 through the bump interposed therebetween after polarities of electrodes of these chips are matched with each other, as illustrated in FIG. 2A.

Figure 2B:
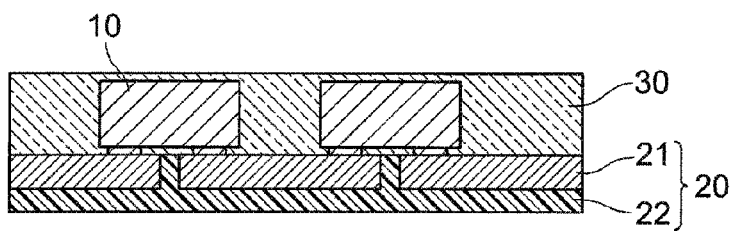

Next, as illustrated in FIG. 2B, the sealing layer 30 is formed to cover the upper surface of the substrate 20 and the entire exposed portion of the LED chip 10 with the sealing material having translucency.

Figure 2C:
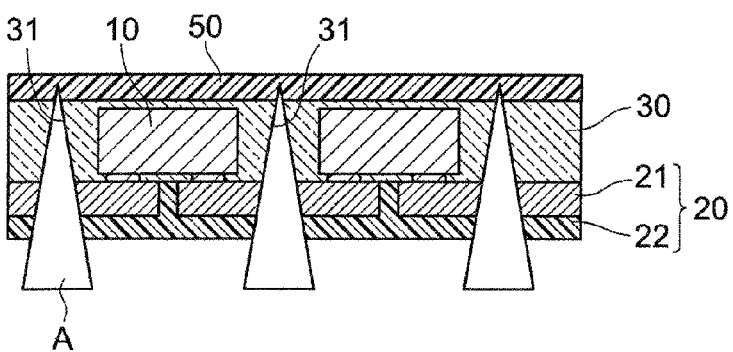

Subsequently, as illustrated in FIG. 2C, a protective layer 50 is formed to cover an upper surface of the sealing layer 30 or is fixedly attached to the upper surface thereof. The protective layer 50 may be made of, for example, a resin such as PET (polyethylene terephthalate) or PVC (polyvinyl chloride) and ceramics. Subsequently, from a side opposite to the side of the substrate 20 mounted with the LED chips 10, tapered grooves are formed in the substrate 20 and the sealing layer 30 between the plurality of LED chips 10 by a first tapered blade A of an upward convex shape (that is, a shape tapered toward an edge. The first tapered blade A moves upward in FIG. 2C while rotating until a cutting edge thereof reaches the upper surface of the sealing layer 30 and cuts off the sealing layer 30. Further, the cutting edge may reach the inside of the protective layer 50, but should not penetrate the protective layer 50. Then, the tapered grooves are similarly formed in the substrate 20 and the sealing layer 30 (further including the protective layer 50 in some cases) in a direction orthogonal to a cutting direction of the cutting-edge by returning the first tapered blade A and rotating the cutting edge 90 degrees. As a result, tapered faces 31 are formed in four directions of the sealing layer 30.

The edge face of the first tapered blade A and the face of the tapered groove formed by the first tapered blade A are illustrated in a linear shape as viewed in a cross section of FIGS. 2A to 2E, but the invention may have a convex-curved shape or a concave-curved shape as viewed in a cross section without being limited thereto and can employ any shape matched to a shape of a reflective surface of the reflector 40 to be required.

Figure 2D:
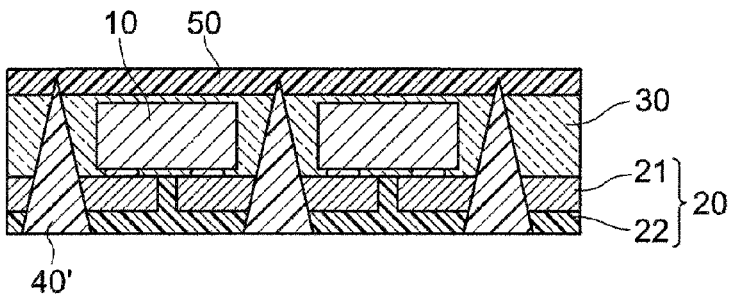

Next, as illustrated in FIG. 2D, the tapered groove, which is formed, is filled with a reflector material 40' made of the white resin material.

Figure 2E:
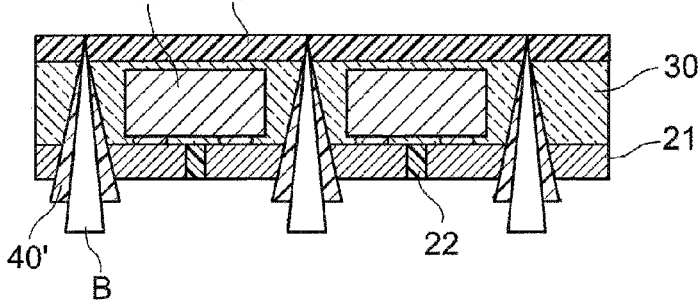

After the reflector material 40' is cured, a dicing process is performed on portions corresponding to the cured reflector material 40' and the tapered groove of the protective layer 50 using a second tapered blade B that has a more acute angle compared to the first tapered blade A, as illustrated in FIG. 2E. At this time, the LED chips 10 are separated from each other when the dicing process is performed such that the protective layer 50 is penetrated and is performed along a whole circumference of the LED chip 10. At this time, the reflector material 40' should remain on at least the side face of the sealing layer 30. In an example illustrated in FIG. 2E, the lead portion 21 is exposed by partial removal of the insulating portion 22 of the substrate 20. By removal of the protective layer 50 and excess reflector material 40', the plurality of light emitting devices 1 of the same specification as illustrated in FIG. 1 are completed.

In an example illustrated in FIG. 2E, the dicing process is performed such that the protective layer 50 is penetrated. Alternatively, the dicing process is performed up to a height such that the protective layer 50 is not penetrated, and thus the light emitting devices 1 may be individually separated by removal of the entire protective layer 50 after each of the reflectors 40 are made by partitioning of the reflector material 40'.

Effects of First Embodiment

Since the reflector 40 is provided to cover the tapered face 31 of the sealing layer 30, light from the LED chip 10 can be effectively reflected by the reflector 40, and light extraction efficiency from the sealing layer 30 is improved.

Since a mold is not used to form the reflector 40, the light emitting device 1 can be simply manufactured, and reduction in manufacturing cost can be also realized.

Since an angle of the tapered face of the reflector 40 can be adjusted depending on an angle of the cutting edge of the first tapered blade A, it is possible to easily change an emission angle of light.

Since the reflector 40 is formed by filling of the tapered groove with the reflector material 40' before the plurality of light emitting devices 1 are formed by cutting and separation of the protective layer 50, there is also no problem that a mold is required to form the reflector after separation for each LED chip 10.

After the plurality of LED chips 10 are formed on the single substrate 20, the sealing layer 30 is formed to cover all of the LED chips 10, the tapered groove is formed by the first tapered blade A, and the light emitting devices 1 having the reflector 40 are individually separated. Thus, it is possible to easily form the light emitting device 1 having a structure in which light is extracted by reflection on the reflector 40 and to improve mass-productivity and productivity.

The protective layer 50 may have a higher hardness than the sealing layer 30. By this, when the cutting edge enters the protective layer 50 out of the sealing layer 30 during the formation of the tapered groove with the first tapered blade A, cutting resistance acting on the first tapered blade A is rapidly changed (increased). By detection of the change in the cutting resistance, it is possible to detect with high accuracy that the cutting edge of the first tapered blade A enters the protective layer 50 and to enhance accuracy of the formation of the tapered groove.

Modified Example of First Embodiment

Figure 3:
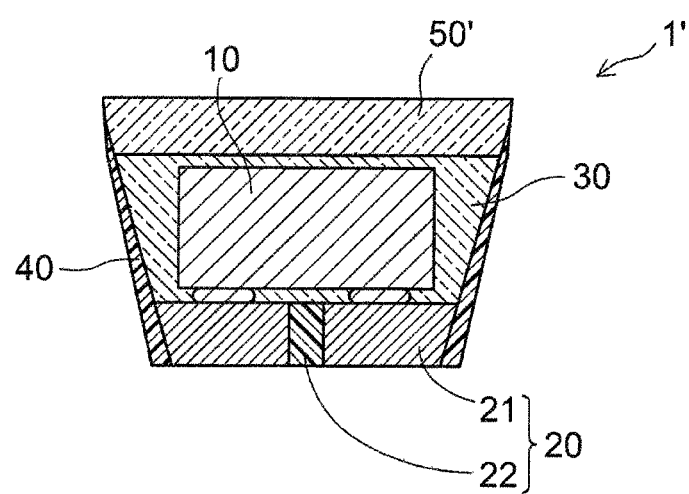
FIG. 3 is a cross-sectional view of a light emitting device according to a modified example of the first embodiment of the invention.

In the method of manufacturing the light emitting device 1 according to the first embodiment as illustrated in FIGS. 2A to 2E, the protective layer 50 is removed after the reflector 40 is formed. Alternatively, as in a light emitting device 1' illustrated in FIG. 3, the light emitting device 1' may be completed in a state where a protective layer 50' is maintained without being removed. In this case, the protective layer 50' is formed of a transparent resin material or a material such as glass having translucency, for the purpose of securing light permeability. The protective layer 50' may contain phosphor particles.

Second Embodiment

Figure 4A:
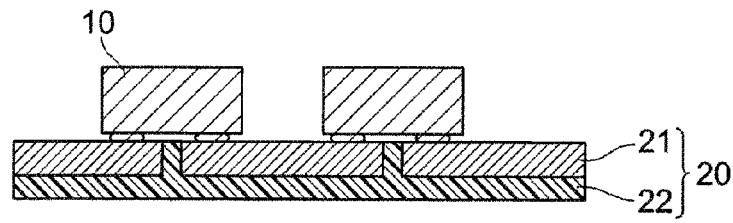
FIGS. 4A to 4E are explanatory diagrams illustrating a method of manufacturing a light emitting device according to a second embodiment of the invention.
Figure 4B:
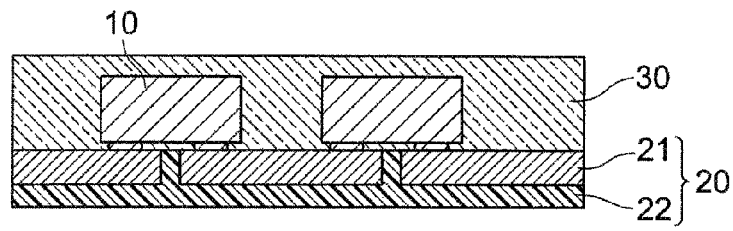

Referring to FIGS. 4A to 4E, a method of manufacturing a light emitting device 1" according to a second embodiment of the invention will be described below. Steps illustrated in FIGS. 4A and 4B are similar to those illustrated in FIGS. 2A and 2B, and thus the description thereof will not be present.

Figure 4C:
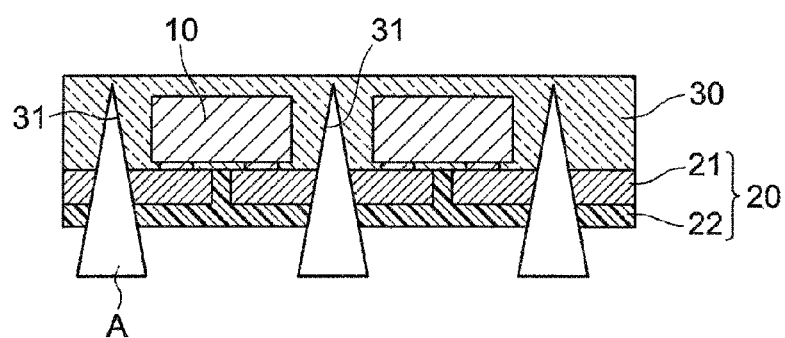

In a step illustrated in FIG. 4C subsequent to the step illustrated in FIG. 4B, from a side opposite to the side of the substrate 20 mounted with the LED chips 10, tapered grooves are formed in the substrate 20 and the sealing layer 30 between the plurality of LED chips 10 by a first tapered blade A of an upward convex shape (that is, a shape tapered toward an edge. The first tapered blade A moves upward in FIG. 4C while rotating until a cutting edge thereof exceeds the height of the upper surface of the LED chip 10 and does not reach the upper surface of the sealing layer 30. Then, the tapered grooves are similarly formed in the substrate 20 and the sealing layer 30 in a direction orthogonal to a cutting direction of the cutting-edge by returning the first tapered blade A and rotating the cutting edge 90 degrees. As a result, tapered faces 31 are formed in four directions of the sealing layer 30.

The edge face of the first tapered blade A and the face of the tapered groove formed by the first tapered blade A are illustrated in a linear shape as viewed in a cross section of FIGS. 4A to 4E, but the invention may have a convex-curved shape or a concave-curved shape as viewed in a cross section without being limited thereto and can employ any shape matched to a shape of a reflective surface of the reflector 40 to be required.

Figure 4D:
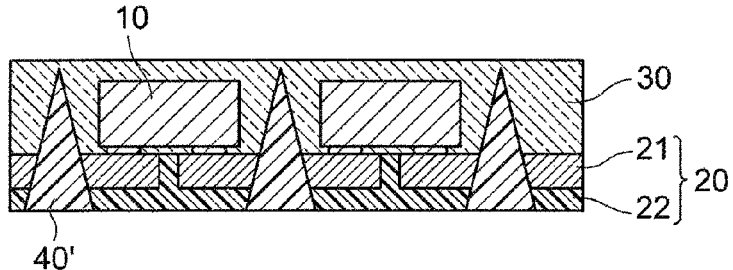

Next, as illustrated in FIG. 4D, the tapered groove, which is formed, is filled with a reflector material 40' made of the white resin material.

Figure 4E:
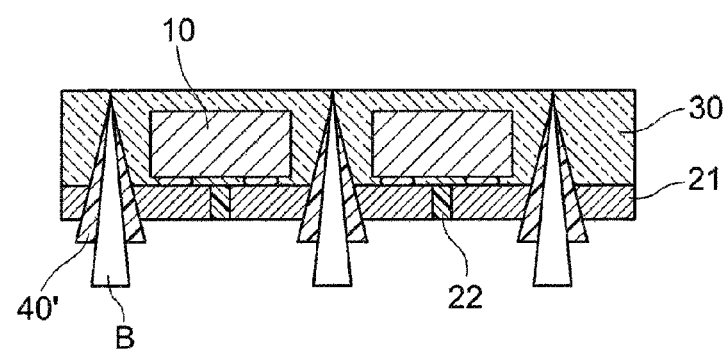
Figure 5:
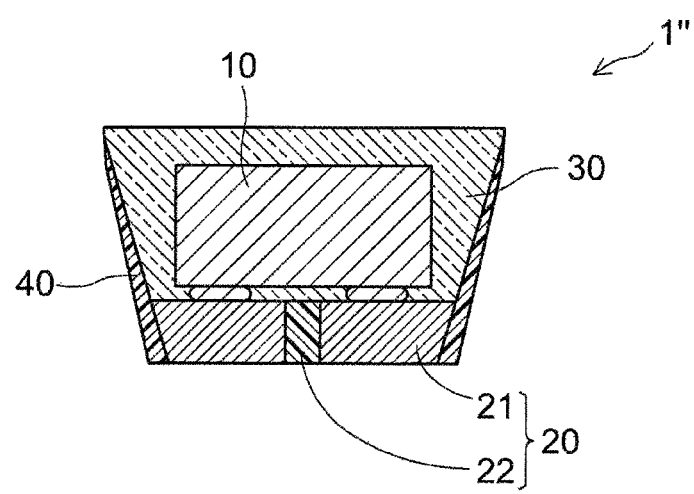
FIG. 5 is a cross-sectional view of the light emitting device according to the second embodiment of the invention.

After the reflector material 40' is cured, a dicing process is performed on portions corresponding to the cured reflector material 40' and the tapered groove of the sealing layer 30 using a second tapered blade B that has a more acute angle compared to the first tapered blade A, as illustrated in FIG. 4E. At this time, the LED chips 10 are separated from each other when the dicing process is performed such that the sealing layer 30 is penetrated and is performed along a whole circumference of the LED chip 10. In an example illustrated in FIG. 4E, the lead portion 21 is exposed by partial removal of the insulating portion 22 of the substrate 20. By removal of excess reflector material 40', the plurality of light emitting devices 1" of the same specification as illustrated in FIG. 5 are completed.

Effects of Second Embodiment

Since the reflector 40 is provided to cover the tapered face 31 of the sealing layer 30, light from the LED chip 10 can be effectively reflected by the reflector 40, and light extraction efficiency from the sealing layer 30 is improved.

In the step illustrated in FIG. 4C, since the tapered groove is formed up to the position higher than the upper surface of the LED chip 10, an upper end of the reflector 40 to be subsequently formed is located at the position higher than the upper surface of the LED chip 10, and a sufficient reflection effect can be obtained by the reflector 40.

Since a mold is not used to form the reflector, the light emitting device 1" can be simply manufactured, and reduction in manufacturing cost can be also realized.

Since an angle of the tapered face of the reflector 40 can be adjusted depending on an angle of the cutting edge of the first tapered blade A, it is possible to easily change an emission angle of light.

Since the reflector 40 is formed by filling of the tapered groove with the reflector material 40' before the plurality of light emitting devices 1" are formed by cutting and separation of the sealing layer 30, there is also no problem that a mold is required to form the reflector after separation for each LED chip 10.

After the plurality of LED chips 10 are formed on the single substrate 20, the sealing layer 30 is formed to cover all of the LED chips 10, the tapered groove is formed by the first tapered blade A, and the light emitting devices 1" having the reflector 40 are individually separated. Thus, it is possible to easily form the light emitting device 1" having a structure in which light is extracted by reflection on the reflector 40 and to improve mass-productivity and productivity.

The present invention is not limited to the description of the above-described aspects and embodiments. Various modifications that can be easily and conceptually reached by a person skilled in the art without departing from the description of the scope of claims are also included in the invention. All the contents of the literatures, the laid-open patent publications, the patent gazettes and the like indicated in the specification are incorporated herein by reference.

The embodiments described above are represented as follows.

(Note 1)

A method of manufacturing a light emitting device, including:

a chip mounting step of mounting an LED chip on a substrate;

a sealing layer forming step of forming a translucent sealing layer for sealing the LED chip;

a protective layer forming step of forming a protective layer on the sealing layer;

a groove forming step of forming a groove, which penetrates the substrate and the sealing layer, using a blade from a side opposite to the side of the substrate mounted with the LED chip, the groove being formed to extend to a lower surface or an inside of the protective layer;
a filling step of filling the groove with a reflector material; and
a separating step of removing and separating a portion of the protective layer in which at least the groove is formed,
wherein the blade used in the groove forming step has a shape tapered toward an edge.

(Note 2)
The method of manufacturing the light emitting device according to Note 1, wherein, in the separating step, a dicing process is perform from the side opposite to the side of the substrate mounted with the LED chip.

(Note 3)
The method of manufacturing the light emitting device according to Note 1, wherein, in the separating step, the entire of the protective layer is removed.

(Note 4)
A method of manufacturing a light emitting device, including:
a chip mounting step of mounting an LED chip on a substrate;
a sealing layer forming step of forming a translucent sealing layer for sealing the LED chip;
a groove forming step of forming a groove, which penetrates the substrate and extends to the middle of the sealing layer, using a blade from a side opposite to the side of the substrate mounted with the LED chip;
a filling step of filling the groove with a reflector material; and
a separating step of further cutting and separating a portion of the sealing layer in which the groove is formed,
wherein the blade used in the groove forming step has a shape tapered toward an edge.

(Note 5)
The method of manufacturing the light emitting device according to Note 4, wherein, in the groove forming step, the groove is formed to extend to a position higher than an upper surface of the chip.

(Note 6)
The method of manufacturing the light emitting device according to Note 4 or 5, wherein, in the separating step, a dicing process is perform from the side opposite to the side of the substrate mounted with the LED chip.

(Note 7)
The method of manufacturing the light emitting device according to any one of Notes 1 to 3, wherein the protective layer has a higher hardness than the sealing layer.

What is claimed is:
1. A method of manufacturing a light emitting device, the method comprising:
mounting an LED chip on a substrate;
forming a translucent sealing layer for sealing the LED chip;
forming a protective layer on the sealing layer;
forming a groove, which penetrates the substrate and the sealing layer, using a blade from a side opposite to a side of the substrate with the LED chip mounted, the groove being formed to extend to an inside of the protective layer;
filling the groove with a reflector material; and
removing and separating a portion of the protective layer in which at least the groove is formed, wherein the blade has a shape tapered toward an edge.
2. The method of manufacturing the light emitting device according to claim 1, wherein
a dicing process is performed from the side opposite to the side of the substrate mounted with the LED chip when the portion of the protective layer is separated.
3. The method of manufacturing the light emitting device according to claim 1, wherein an entirety of the protective layer is removed when the portion of the protective layer is separated.
4. The method of manufacturing the light emitting device according to claim 1, wherein
a plurality of LED chips are mounted on the substrate and are electrically connected to a lead portion of the substrate, wherein a connection from each LED chip to the lead portion is devoid of a wire bonding.
5. A method of manufacturing a light emitting device, the method comprising:
mounting an LED chip on a substrate;
forming a translucent sealing layer for sealing the LED chip;
forming a groove, which penetrates the substrate and extends to end at a middle of the sealing layer, located above a bottom surface of the sealing layer and below an upper surface of the sealing layer, using a blade from a side opposite to a side of the substrate with the LED chip mounted;
filling the groove with a reflector material; and
cutting and separating a portion of the sealing layer in which the groove is formed, wherein
the blade has a shape tapered toward an edge.
6. The method of manufacturing the light emitting device according to claim 5, wherein
the groove is formed to extend to a position higher than an upper surface of the chip.
7. The method of manufacturing the light emitting device according to claim 5, wherein
a dicing process is performed from the side opposite to the side of the substrate with the LED chip mounted when the portion of the sealing layer is separated.
8. The method of manufacturing the light emitting device according to claim 5, wherein
a plurality of LED chips are mounted on the substrate and are electrically connected to a lead portion of the substrate, wherein a connection between each LED chip and the lead portion is devoid of a wire bonding.
9. The method of manufacturing the light emitting device according to claim 5, wherein the substrate comprises a lead portion, and an insulating portion adjacent to the lead portion.
10. A method of manufacturing a light emitting device, the method comprising:
mounting an LED chip on a substrate;
forming a translucent sealing layer for sealing the LED chip;
forming a protective layer on the sealing layer,
forming a groove, which penetrates the substrate and the sealing layer, using a blade from a side opposite to a side of the substrate with the LED chip mounted, the groove being formed to extend to a lower surface or an inside of the protective layer;
filling the groove with a reflector material; and
removing and separating a portion of the protective layer in which at least the groove is formed, wherein
the blade has a shape tapered toward an edge, and wherein the substrate comprises a lead portion, and an insulating portion adjacent to the lead portion.
11. The method of manufacturing the light emitting device according to claim 10, wherein the LED comprises one LED chip of a plurality of LED chips and wherein each LED chip is electrically connected to the lead portion of the substrate, wherein a connection between each LED chip and the lead portion is devoid of a wire bonding.

* * * * *